(12) United States Patent
Takiguchi et al.

(10) Patent No.: US 10,090,636 B2
(45) Date of Patent: Oct. 2, 2018

(54) SEMICONDUCTOR LASER DEVICE

(71) Applicant: HAMAMATSU PHOTONICS K.K., Hamamatsu-shi, Shizuoka (JP)

(72) Inventors: Yuu Takiguchi, Hamamatsu (JP); Kazuyoshi Hirose, Hamamatsu (JP); Yoshiro Nomoto, Hamamatsu (JP); Takahiro Sugiyama, Hamamatsu (JP); Yoshitaka Kurosaka, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/541,515

(22) PCT Filed: Jan. 7, 2016

(86) PCT No.: PCT/JP2016/050370
§ 371 (c)(1),
(2) Date: Jul. 5, 2017

(87) PCT Pub. No.: WO2016/111332
PCT Pub. Date: Jul. 14, 2016

(65) Prior Publication Data
US 2018/0006426 A1     Jan. 4, 2018

(30) Foreign Application Priority Data

Jan. 9, 2015   (JP) ................................. 2015-003557

(51) Int. Cl.
*H01S 5/02*     (2006.01)
*G02F 1/1335*   (2006.01)
(Continued)

(52) U.S. Cl.
CPC ............ *H01S 5/02* (2013.01); *G02B 27/1026* (2013.01); *G02F 1/133504* (2013.01); *H01S 5/18* (2013.01)

(58) Field of Classification Search
CPC ......... H01S 5/02; H01S 5/18; G02B 27/1026; G02F 1/133504
See application file for complete search history.

(56) References Cited

U.S. PATENT DOCUMENTS 5,301,201 A *   4/1994   Dutta ..................... G02F 1/29
                                                    372/101
7,203,210 B2 *  4/2007   Sox .................... G02B 27/0087
                                                    372/26
2002/0145687 A1* 10/2002 Mitsui ............... G02F 1/133603
                                                    349/113

FOREIGN PATENT DOCUMENTS

JP     2002-049002 A    2/2002
JP     2002-55322 A     2/2002
(Continued)

OTHER PUBLICATIONS

Lippmann, "Integral Photography," Scientific American, Aug. 19, 1911, p. 164.

(Continued)

*Primary Examiner* — Xinning Niu
(74) *Attorney, Agent, or Firm* — Drinker Biddle & Reath LLP

(57) ABSTRACT

Provided is a semiconductor laser device including a plurality of semiconductor laser units LDC that are capable of being independently driven, and a spatial light modulator SLM that is optically coupled to a group of the plurality of semiconductor laser units LDC. Each of the semiconductor laser units includes a pair of clad layers having an active layer 4 interposed therebetween, and a diffractive lattice layer 6 that is optically coupled to the active layer 4. The semiconductor laser device includes a ¼ wavelength plate 26 that is disposed between a group of the active layers 4 of the plurality of semiconductor laser units LDC and a reflection film 23, and a polarizing plate 27 that is disposed (Continued)

between the group of the active layers 4 of the plurality of semiconductor laser units LDC and a light emitting surface.

10 Claims, 5 Drawing Sheets

(51) Int. Cl.
*G02B 27/10* (2006.01)
*H01S 5/18* (2006.01)

(56) References Cited

FOREIGN PATENT DOCUMENTS

| | | |
|---|---|---|
| JP | 2002-72206 A | 3/2002 |
| JP | 2002-328630 A | 11/2002 |
| JP | 2005-521197 A | 7/2005 |
| JP | 2005-277080 A | 10/2005 |
| JP | 2007-52160 A | 3/2007 |
| JP | 2007-328336 A | 12/2007 |
| JP | 2008-502925 A | 1/2008 |
| JP | 2013-522666 A | 6/2013 |
| WO | WO-03/078892 A1 | 9/2003 |
| WO | WO-2005/119352 A1 | 12/2005 |
| WO | WO-2011/112962 A1 | 9/2011 |
| WO | WO-2014/175447 A1 | 10/2014 |
| WO | WO-2015/008627 A1 | 1/2015 |

OTHER PUBLICATIONS

Ernst Lueder, "Integral Imaging," 3D Displays, 2012, pp. 185-214.
International Preliminary Report on Patentability dated Jul. 20, 2017 for PCT/JP2016/050370.

\* cited by examiner (A)

(B)

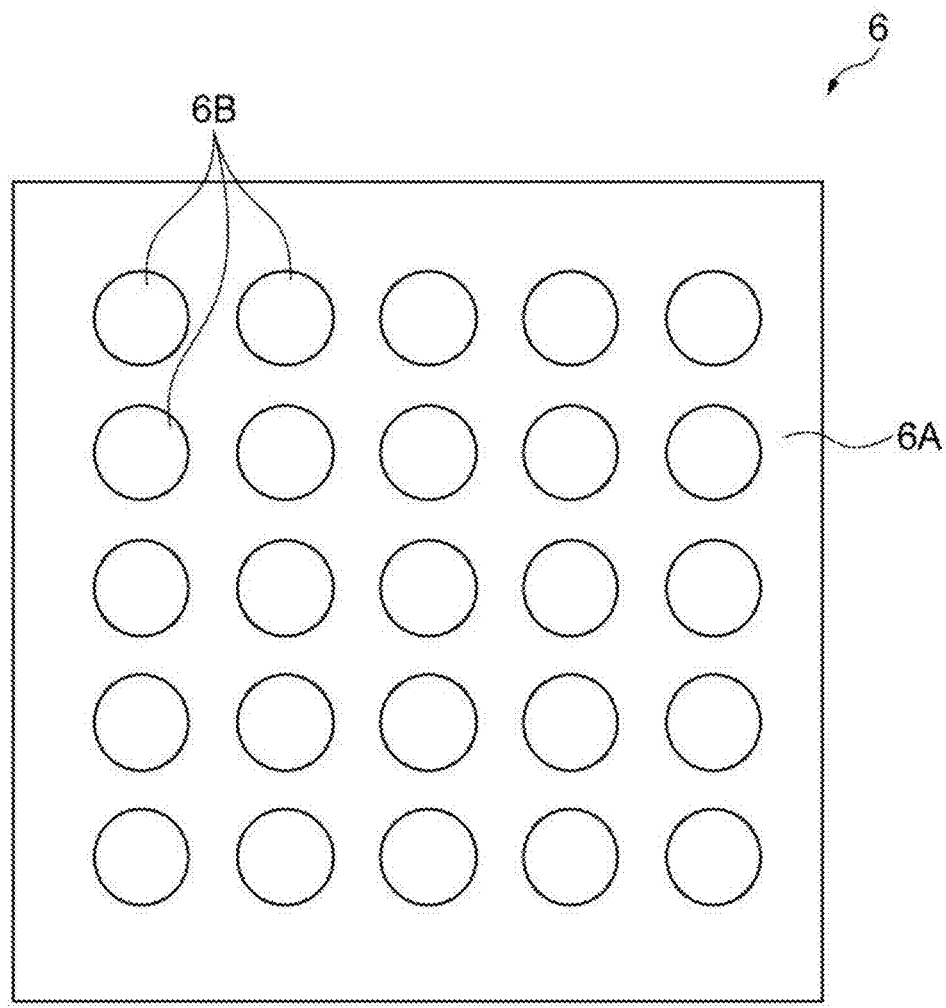

SEMICONDUCTOR LASER DEVICE

TECHNICAL FIELD

The present invention relates to a semiconductor laser device functioning as a spatial light modulation light source.

BACKGROUND ART

In recent years, stereoscopic display of an integral photography system has been known (see Non-Patent Literature 1 and Non-Patent Literature 2). In such a type of stereoscopic display, a liquid crystal display panel is disposed such that a plurality of pixels are arranged on the back side of a lenticular lens. Light beams emitted from respective liquid crystal display panels belonging to the same lenticular lens travel at different angles. Therefore, it is possible to give a desired image for each angle by giving an appropriate image to each of the liquid crystal display panels and to enable stereoscopic display based on an integral photography system.

CITATION LIST

Non Patent Literature

[Non-Patent Literature 1] Lippmann, "Integral photography", Scientific American, the August 1911 issue, p. 164
[Non-Patent Literature 2] Ernst Lueder "3D Displays", John Wiley & Sons, 2012, p. 185-214

SUMMARY OF INVENTION

Technical Problem

However, in a case of a semiconductor laser device in which a liquid crystal panel is combined with a lenticular lens, it is necessary to provide a large number of liquid crystal display panels in accordance with a large number of viewpoints. Therefore, since the entire system becomes larger in size, it is difficult to sufficiently bring a plurality of rays of light necessary for the formation of a stereoscopic image into the pupil, and thus there is a problem in that a natural stereoscopic image is not obtained.

The invention is contrived in view of such situations, and an object thereof is to provide a semiconductor laser device which is also applicable to the formation of a natural stereoscopic image.

Solution to Problem

In order to solve the above-described problem, there is provided a first semiconductor laser device which is a semiconductor laser device including a plurality of semiconductor laser units that are capable of being independently driven and a spatial light modulator that is optically coupled to a group of the plurality of semiconductor laser units, (1) in which each of the semiconductor laser units includes an active layer, a pair of clad layers that has the active layer interposed therebetween, and a diffractive lattice layer that is optically coupled to the active layer, in which the plurality of semiconductor laser units output laser beams along respective thickness directions, (2) in which the spatial light modulator includes a liquid crystal layer, a reflection film that is provided on a side opposite to the semiconductor laser unit with respect to the liquid crystal layer, a plurality of pixel electrodes that are two-dimensionally disposed, and a common electrode that interposes the liquid crystal layer interposed between the common electrode and the pixel electrode, (3) in which a laser beam emitted from each of the semiconductor laser units is incident on the spatial light modulator and is modulated in accordance with a state of the liquid crystal layer based on the pixel electrodes, in which the laser beam reflected by the reflection film of the spatial light modulator and modulated is output to an outside from a light emitting surface of each of the semiconductor laser units again through each of the semiconductor laser units, and (4) in which the semiconductor laser device further includes a ¼ wavelength plate that is disposed between a group of the active layers of the plurality of semiconductor laser units and the reflection film, and a polarizing plate that is disposed between the group of the active layers of the plurality of semiconductor laser units and the light emitting surface.

According to this semiconductor laser device, a laser beam which is output from the semiconductor laser unit, which is a surface-emission laser element, is emitted along the thickness direction, is reflected by the reflection film of the spatial light modulator, is subjected to phase modulation in the liquid crystal layer, and is output to the outside through the polarizing plate. Therefore, the direction of a laser beam which is subjected to phase modulation and is output from the polarizing plate for each pixel is different in accordance with the intensity of modulation in the liquid crystal layer. A laser beam to be emitted to the outside from the semiconductor laser unit without going through the spatial light modulator can be suppressed by the polarizing plate. That is, regarding a laser beam passing through the ¼ wavelength plate twice by being incident on the spatial light modulator and being reflected, the phase of the laser beam is reversed, and thus the polarization azimuth thereof is rotated at 90 degrees. Accordingly, the laser beam passes through the polarizing plate.

That is, when the polarization azimuth of the laser beam in the active layer is set to be a first direction (A), a polarization azimuth (B) transmitted by the polarizing plate is perpendicular to the first direction (A), and the laser beam cannot directly pass through a wavelength plate. On the other hand, the laser beam having passed through the ¼ wavelength plate twice has the polarization azimuth (B) perpendicular to the first direction (A) in a case where there is no liquid crystal layer, and can pass through the polarizing plate. A bias voltage is applied between the pixel electrode and the common electrode, and thus only a polarization component of which the phase is adjusted by the liquid crystal layer passes through the polarizing plate.

Meanwhile, it is preferable that a width of each of the pixel electrodes is equal to or less than half a width of each of the semiconductor laser units. The width of the pixel electrode is smaller than the width of each of the semiconductor laser units, and two or more pixel electrodes are disposed corresponding to a single semiconductor laser unit. Thereby, light generated from each semiconductor laser unit goes to and returns from the spatial light modulator and is then two-dimensionally subjected to phase modulation for each pixel of the spatial light modulator. As a result, it is possible to control a beam pattern for each semiconductor laser unit. Therefore, a signal is applied to a spatial light modulator driving circuit so as to apply a peak beam having a direction controlled as an output beam pattern, and thus it is possible to output the peak beam in any direction for each semiconductor laser unit. At this time, an arrangement period L of the semiconductor laser unit is set to equal to or less than half the diameter of the pupil of an eye, and thus it is possible to form a natural stereoscopic image of an integral system. At this time, a maximum diffraction angle Φ of the peak beam in any direction from each semiconductor laser unit can be represented by $\Phi \approx \lambda/d$ by using a pixel pitch d of the spatial light modulator and a wavelength λ, and thus it is necessary to appropriately set a small d in order to obtain a desired Φ.

Meanwhile, in the above-described example, the peak beam is output in any direction for each semiconductor laser unit, but it is possible to obtain any beam pattern for each semiconductor laser unit as long as the pixel pitch d has an appropriate value and to obtain a plurality of beams in any direction for each semiconductor laser unit. In this case, the beams in multiple directions are simultaneously obtained in parallel, and thus it is possible to increase the number of viewpoints when a natural stereoscopic image is displayed and formed. Alternatively, it is possible to increase a frame rate by setting the same number of viewpoints.

In a second semiconductor laser device, the plurality of semiconductor laser units include a first semiconductor laser unit that outputs a laser beam having a first wavelength, a second semiconductor laser unit that outputs a laser beam having a second wavelength, and a third semiconductor laser unit that outputs a laser beam having a third wavelength, and the first, second, and third wavelengths are different from each other.

According to this semiconductor laser device, laser beams having three or more types of wavelengths are used, and thus it is possible to form a stereoscopic image having various colors.

In a third semiconductor laser device, the plurality of semiconductor laser units include a fourth semiconductor laser unit that outputs a laser beam having a fourth wavelength, a fifth semiconductor laser unit that outputs a laser beam having a fifth wavelength, and a sixth semiconductor laser unit that outputs a laser beam having a sixth wavelength, and the first, second, third, fourth, fifth, and sixth wavelengths are different from each other.

According to this semiconductor laser device, laser beams having six or more types of wavelengths can be used, and thus it is possible to form a stereoscopic image having further various colors.

Advantageous Effects of Invention

According to the invention, it is possible to provide a semiconductor laser device which is also applicable to the formation of a natural stereoscopic image.

BRIEF DESCRIPTION OF DRAWINGS

FIG. 5 is a plan view of a diffractive lattice layer.

DESCRIPTION OF EMBODIMENTS

Figure 1:
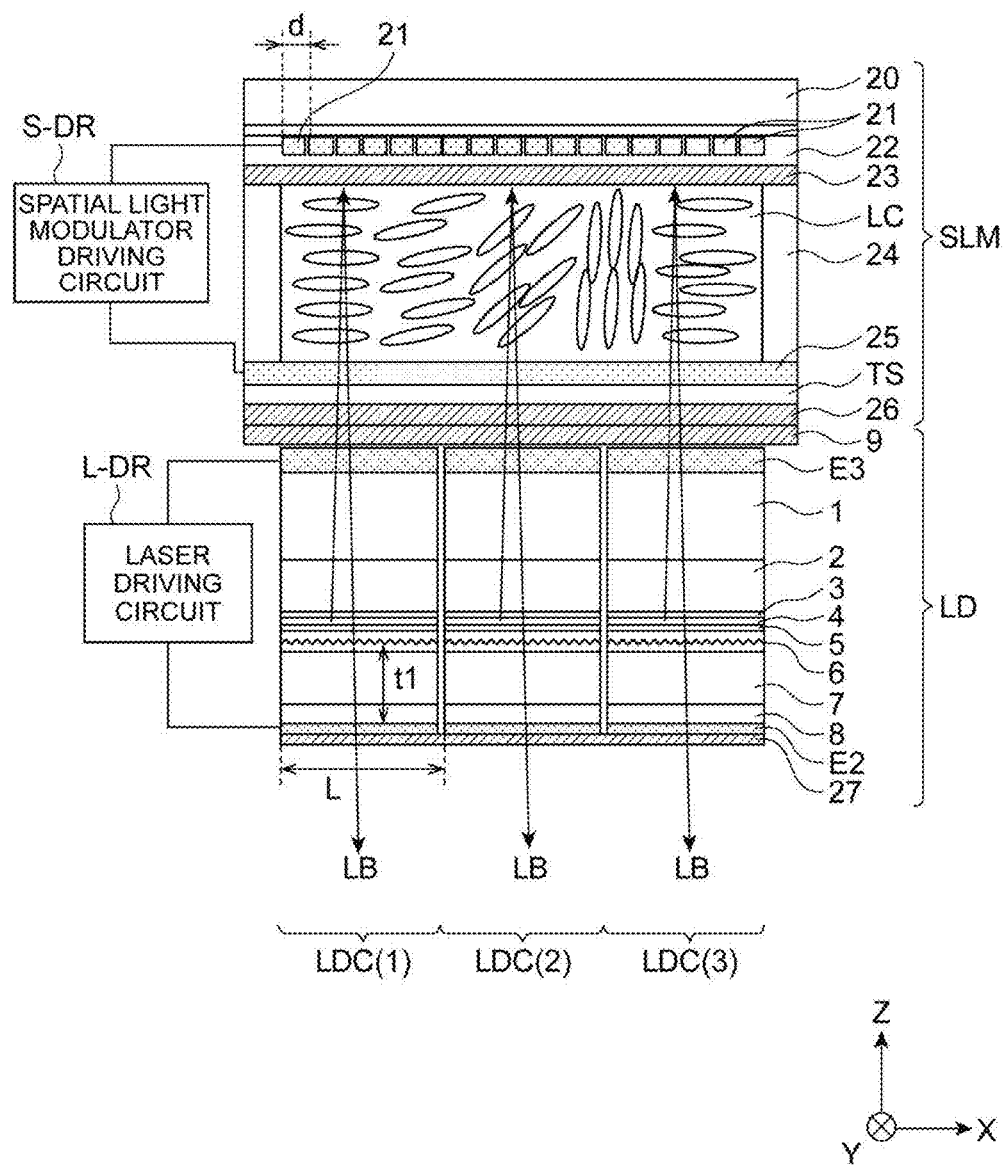
FIG. 1 is a diagram illustrating a configuration in the longitudinal section of a semiconductor laser device according to a first embodiment.

Hereinafter, a semiconductor laser device according to an embodiment will be described. The same components are denoted by the same reference numerals and signs, and a repeated description will be omitted.

FIG. 1 is a diagram illustrating a configuration in the longitudinal section of a semiconductor laser device according to a first embodiment.

The semiconductor laser device includes a plurality of semiconductor laser chips LDC(N) (N is a natural number: FIG. 1 illustrates a case of N=1, 2, 3) each of which is constituted by a compound semiconductor, and a spatial light modulator SLM which is optically coupled to a group of the semiconductor laser chips LDC(N). In the drawing, although the semiconductor laser chips LDC(N) are shown as completely separate chips, these may be formed on a common substrate and an isolation structure may be provided between the chips. Both in a case of complete separation and a case of isolation separation, each of the semiconductor laser chips LDC(N) functions as a semiconductor laser unit.

The semiconductor laser chip LDC includes a light emitting layer including an active layer 4, a pair of clad layers 2 and 7 having the light emitting layer interposed therebetween, and a diffractive lattice layer 6 which is optically coupled to the light emitting layer. Meanwhile, the light emitting layer includes the active layer 4 and light guide layers 3 and 5 having the active layer interposed therebetween when necessary. Each of the semiconductor laser chips LDC includes a semiconductor substrate 1. The thickness direction of the semiconductor substrate 1 is set to be a Z-axis, and two directions perpendicular to the Z-axis are set to be an X-axis and a Y-axis, respectively.

It is assumed that semiconductor layers are sequentially epitaxially grown on the surface of the semiconductor substrate 1 in the −Z-axis direction during the manufacture of the semiconductor laser device. In this case, in a case where the −Z-axis direction is set to be an upward direction, the lower clad layer 2, the light emitting layers (the light guide layer 3, the active layer 4, and the light guide layer 5), the diffractive lattice layer 6, the upper clad layer 7, and a contact layer 8 are sequentially formed on the semiconductor substrate 1. A driving electrode E3 is formed on the surface of the semiconductor substrate 1 on the +Z-axis side, and an electrode E2 is formed on the surface of the contact layer 8 on the −Z-axis side. These electrodes E3 and E2 are driving electrode, and each of the driving electrodes has a plurality of openings having a stripe shape or a mesh shape which expand on the entire surface of the semiconductor substrate or is constituted by a transparent electrode.

When a current is supplied between the driving electrode E3 and the second electrode E2 of each of the semiconductor laser chips LDC from a laser driving circuit L-DR, the light emitting layers independently emit light. That is, in a case where a driving current is supplied between the driving electrode E3 and the second electrode E2, recoupling between electrons and holes occurs within the active layer 4, and the active layer 4 emits light. Carriers contributing to the emission of light and the emitted light are efficiently enclosed between the light guide layers 3 and 5 and the clad layers 2 and 7 which are located on the upper and lower sides.

A laser beam LB generated in the light emitting layer propagates through the diffractive lattice layer 6, and the diffractive lattice layer 6 emits the laser beam in a direction perpendicular to the thickness direction, that is, the Z-axis direction. The laser beam which is emitted from the diffractive lattice layer 6 travels in the +Z-axis direction and is incident on the spatial light modulator SLM through the clad layer 2 and the semiconductor substrate 1.

The spatial light modulator SLM is attached to the group of the semiconductor laser chips LDC so that the laser beam LB which is output along the thickness direction of the diffractive lattice layer 6 is input to the spatial light modulator. The laser beam is incident on a liquid crystal layer LC through a transparent electrode out of a common electrode 25 and a pixel electrode 21 of the spatial light modulator SLM. The positions of these electrodes can be replaced with each other, and the pixel electrode 21 can also be configured as a transparent electrode. The spatial light modulator SLM modulates the phase of the laser beam LB for each minute region by a driving voltage applied between the pixel electrode and the common electrode, reflects the laser beam of which the phase has been modulated, and outputs the reflected laser beam to the outside through the semiconductor laser chip.

The laser beams LB which are output from the respective spatial light modulators SLM are superimposed on each other in a state where the phases thereof for each minute region are adjusted, thereby forming various laser beam patterns. For example, far-field images of the superimposed laser beams LB can constitute specific characters.

In this semiconductor laser device, a beam direction can be changed by the spatial light modulator SLM, and a plurality of laser beams deflected are incident on the pupil of an eye. Since the plurality of laser beams are incident on the pupil of the eye, a width L (arrangement period) of the semiconductor laser chip LDC in the X-axis direction is set to equal to or less than 2.5 mm. In addition, a width d (pitch) of the pixel electrode 21 of the spatial light modulator SLM in the X-axis direction is set to equal to or less than 60 μm in order to obtain the actual swing angle of the beam.

The semiconductor laser device is disposed on the semiconductor laser chip LDC and further includes a spatial light modulator driving circuit S-DR (including a row selection circuit and a column selection circuit) which selectively applies a driving voltage, between the pixel electrode and the common electrode which are positioned at desired addresses. These selection circuits are provided on the semiconductor laser chip, and thus it is possible to control the spatial light modulator without installing a large-sized external wiring group.

The spatial light modulator SLM includes the transparent common electrode 25, the plurality of transparent pixel electrodes 21, and the liquid crystal layer LC disposed between the common electrode 25 and the pixel electrodes 21, and the common electrode 25 is formed on a transparent substrate TS. The liquid crystal layer LC is formed of nematic liquid crystal, ferroelectric liquid crystal, or the like. A driving current is supplied from the driving circuit to the semiconductor laser chip constituting a semiconductor laser element through the driving electrode. Thereby, the laser beam LB is output from the light emitting layer, reaches the liquid crystal layer LC through the pixel electrodes 21 of the spatial light modulator, is subjected to phase modulation in the liquid crystal layer LC, is reflected by a reflecting mirror or a reflection film 23, and is output to the outside through the common electrode 25. The common electrode 25 is connected to a fixed potential (ground), and the pixel electrodes 21 are connected to the row selection circuit through a switching element and a row line. A column line extends from the column selection circuit, and is connected to a control terminal of the switching element. The switching element is a field effect transistor. In this case, the control terminal serves as a gate of the transistor.

In the spatial light modulator, in a case where a specific address (x, y) is designated, an ON signal is output to the column line of the coordinate x from the column selection circuit, and a desired potential is applied to the row line of the coordinate y from the row selection circuit. In this case, a driving voltage is applied between the pixel electrode 21 and the common electrode 25 at the address (x, y), and a refractive index of the liquid crystal layer changes, whereby the length of a light path changes and the phase of the laser beam is adjusted. Meanwhile, in the spatial light modulator, a row direction and a column direction are determined according to subjectivity and are directions replaceable with each other. The magnitude of the driving voltage is determined depending on an output potential from the row selection circuit and an output potential from the column selection circuit. However, in a case where phase control is performed more precisely, for example, a variable resistor may be connected for each switching element, and the value of the variable resistor may be controlled by a selection circuit having the same configuration.

Meanwhile, a storage device and a driving circuit for the spatial light modulator may be provided. The storage device measures a phase distribution of the spatial light modulator in advance so that a device outputs a desired pattern even when the phase of the spatial light modulator varies in a plane during the manufacture of the semiconductor laser device, and corrects the phase distribution. The driving circuit generates a driving voltage applied to each pixel electrode through the selection circuit on the basis of data stored in the storage device may be provided. That is, the semiconductor laser device may include the storage device that measures a phase distribution of the spatial light modulator in advance, stores a correction value of an initial phase for correcting the in-plane variation of the phase on the basis of a measured value, and applies a different initial phase for each pixel electrode of the spatial light modulator. In other words, the semiconductor laser device includes the storage device (not shown) that stores an initial correction value of a driving voltage for each pixel electrode. The driving voltage is applied from a control device (not shown) to the row selection circuit and the column selection circuit of the spatial light modulator driving circuit S-DR, but the driving voltage and the initial correction value are stored in the storage device. A reference phase distribution and the measured phase distribution are compared with each other, and the value of the driving voltage corresponding to a difference in phase for each pixel can be set to be the initial correction value. In a case where the driving voltage having the initial correction value is applied to the pixel electrode, the reference phase distribution is realized. In order to obtain a desired phase distribution, a desired driving voltage can be superimposed on the driving voltage corresponding to the initial correction value.

In addition, the semiconductor laser device may include a storage device and a correction circuit. The storage device measures the intensity of a light output in advance with respect to each phase of the spatial light modulator on the assumption that a polarization state is disturbed due to the penetration of liquid crystal, which results in a change in the intensity of output light obtained by the penetration of a polarizing plate, and corrects the intensity of output light. The correction circuit corrects a driving current applied to the semiconductor laser chip LDC for each phase pattern on the basis of data stored in the storage device. In other words, the semiconductor laser device may include a correction circuit (not shown) for correcting a driving current for each semiconductor laser chip, and a storage device (not shown) that stores a correction value of a current value for correcting a driving current applied to the semiconductor laser chip LDC for each phase pattern of all pixels included in a range corresponding to each semiconductor laser chip. Accordingly, it is possible to correct a driving current for each semiconductor laser chip LDC at each moment (within each frame) in accordance with a phase pattern of all pixels corresponding to each semiconductor laser chip LDC and to realize a uniform distribution of the amount of light which is not influenced by the disturbance of a polarization state due to the penetration of liquid crystal.

Meanwhile, although correction using the storage device has been described above, a configuration may be adopted in which a unit that monitors the output of each semiconductor laser chip LDC and a feedback circuit for performing feedback control in accordance with the monitored output value are provided instead of the storage device.

A laser beam which is output from the diffractive lattice layer 6 in the thickness direction reaches the liquid crystal layer LC through the common electrode 25 (or the pixel electrode 21 in a case where the position thereof is replaced with the pixel electrode). A dielectric constant (refractive index) of the liquid crystal layer LC changes depending on a voltage to be applied to the pixel electrode 21. Accordingly, the length of a light path of the liquid crystal layer LC with respect to the laser beam changes, and a phase changes. The phase of the laser beam LB reciprocating while passing through the liquid crystal layer LC is modulated for each pixel electrode 21. Therefore, it is possible to perform wavefront control for each minute region and to form a desired changeable laser beam pattern by the superimposition of wave fronts.

Meanwhile, a transparent insulating film (antireflection film) 9 formed of $SiO_2$ or $SiN_x$ is formed on the driving electrode E3. A ¼ wavelength plate 26 of the spatial light modulator SLM, a transparent substrate TS, and the common electrode 25 are disposed on the transparent insulating film 9. A frame-shaped spacer 24 for holding liquid crystal is provided on the common electrode 25, and the internal space of the spacer 24 is filled with the liquid crystal layer LC. The reflection film 23 is formed on the spacer 24 and the liquid crystal layer LC, and the plurality of pixel electrodes 21 are disposed on the reflection film 23 through the protection film 22. The pixel electrodes 21 are positioned between the substrate 20 and the protection film 22. When the pixel electrodes 21 and the like are formed, the pixel electrodes 21 are preferably formed on the substrate 20 formed of a semiconductor, the protection film 22 is covered with the pixel electrodes 21 so that the surfaces of the pixel electrodes are flattened, the reflection film 23 is formed on the protection film 22, and the substrate which is an intermediate is reversed and is disposed on the frame-shaped spacer 24. Meanwhile, an appropriate alignment film is provided on the upper and lower surfaces of the liquid crystal layer LC.

The laser beam LB reflected by the reflection film 23 on the liquid crystal layer LC is output to the outside through the common electrode 25 and the semiconductor laser chip LDC. In addition, a distance t1 between (an intermediate position in the thickness direction of) the diffractive lattice layer 6 and the contact layer 8 is set so that the laser beam LB reflected from the exposed surface of the contact layer 8 in the semiconductor laser chip and light which is directly directed to the spatial light modulator SLM from the diffractive lattice layer 6 are intensified. That is, the distance t1 can satisfy the following relation.

$$2 \times t1 = \lambda \times N \text{ or } 2 \times t1 = \lambda \times (N + \tfrac{1}{2})$$

wherein, $\lambda$ denotes the wavelength of a laser beam, and N is set so as to satisfy an integer.

The light emitting layer is constituted by the active layer 4 and the light guide layers 3 and 5 having the active layer interposed therebetween, and the contact layer 8 is provided when necessary. The semiconductor laser chip includes a laser beam generation region LD having the active layer 4 formed therein, and the diffractive lattice layer 6 is positioned in the laser beam generation region LD and emits the laser beam LB toward the thickness direction of the diffractive lattice layer 6. The spatial light modulator SLM is mounted on the laser beam generation region LD. In a case of this structure, it is possible to miniaturize the device by disposing the spatial light modulator SLM on the laser beam generation region LD.

Meanwhile, the driving electrode E3 is disposed on the surface of the semiconductor substrate 1 on the +Z side. The semiconductor laser device is a semiconductor laser device that includes the semiconductor laser chip LDC and the spatial light modulator SLM which is optically coupled to the semiconductor laser chip LDC, modulates the laser beam LB which is output along the thickness direction of the semiconductor laser chip LDC by the spatial light modulator SLM, and outputs the modulated laser beam to the outside. The semiconductor laser chip LDC includes the active layer 4, the pair of clad layers 2 and 7 having the active layer 4 interposed therebetween, the diffractive lattice layer 6 which is optically coupled to the active layer 4, and the driving electrode E3 which is disposed between the clad layer 2 on the spatial light modulator SLM side and the spatial light modulator SLM and is used to supply a current to the active layer 4.

Meanwhile, an XYZ three-dimensional orthogonal coordinate system is provided. However, in a case where the thickness direction of the semiconductor laser chip LDC is set to be a Z-axis direction and a plane parallel to an interface between the semiconductor laser chip LDC and the spatial light modulator SLM is set to be an XY plane, the driving electrode E3 is positioned within the XY plane. In addition, the driving electrode E3 has a plurality of openings when seen from the Z-axis direction, and the driving electrode E3 has a non-periodic structure, but may also be constituted by a transparent electrode such as indium tin oxide (ITO).

A metal such as Ag or Au can be used as the material of a conductive region constituting the driving electrode, but the conductive region may also be formed by diffusing impurities of higher concentration than that of the semiconductor substrate 1 into the semiconductor substrate. Meanwhile, a transparent electrode such as ITO, ZnO, graphene, or Ag nanowire may also be used as the material of the driving electrode. However, since a row-resistance material is more preferable, it is preferable to use an opaque metal material having a stripe-shaped or mesh-shaped opening, instead of the transparent electrode.

The transparent insulating film 9 is formed on the driving electrode. The spatial light modulator SLM is provided on the driving electrode E3. In this case, the row selection circuit and the column selection circuit, which are not shown in the drawing, are positioned outside the driving electrode E3, and thus appropriate connection wiring is performed from the circuits to the pixel electrode and the common electrode. In addition, the electrode E2 is configured to transmit a portion or the entirety of the laser beam LB. Regarding the electrode E2, it is also possible to adopt the same structure as that of the driving electrode E3.

For example, the diffractive lattice layer 6 has a structure in which triangular shapes are arranged in a square lattice shape, and diffracts linearly polarized light in a vertical direction. When a polarization transmission axis of the linearly polarized light which is output from the diffractive lattice layer 6 at this time is set to be an axis A, a polarization transmission axis of the polarizing plate 27 is set to be in a direction (referred to as an axis B) which is perpendicular to the axis A. In addition, a fast axis of the ¼ wavelength plate is set to be in a direction rotated from the axis A at 45 degrees. The polarization azimuth of a laser beam which is incident on the spatial light modulator SLM through the ¼ wavelength plate 26 and passes through the ¼ wavelength plate 26 again in the opposite direction while going to and returning from the spatial light modulator SLM is rotated at 90 degrees. That is, in a case where the laser beam LB is incident on the ¼ wavelength plate 26 as linearly polarized light having a first polarization direction (axis A), the laser beam passes through the ¼ wavelength plate twice and then changes to linearly polarized light having a second polarization direction (axis B) rotated at 90 degrees with respect to the first polarization direction.

Therefore, when a polarization direction in the polarizing plate 27 is made to conform to the second polarization direction (axis B), only a laser beam going to and returning from the spatial light modulator SLM passes through the polarizing plate 27, and components of the other polarization directions are blocked by the polarizing plate 27. Therefore, noise components having not been modulated based on the liquid crystal layer LC are removed from an output image, and thus a contrast is improved. Meanwhile, the position of the common electrode 25 can be replaced with the position of the ¼ wavelength plate 26.

FIG. 5 is a plan view of the diffractive lattice layer.

The diffractive lattice layer 6 described above is constituted by, for example, a base layer 6A and different refractive index regions 6B. The different refractive index region 6B is embedded in the base layer 6A so as to have a predetermined depth, and has a different refractive index from that of the base layer. A planar shape of the different refractive index region 6B is shown as a circular shape, but may also be another shape such as a triangular shape or an elliptical shape. For example, in order to increase the intensity of a specific polarization direction, the planar shape may be a shape that does not have 90-degree rotational symmetry. In order to obtain linearly polarized light, the planar shape may be, for example, an isosceles triangular shape, a right triangular shape, or an isosceles right triangular shape. The different refractive index region 6B is disposed at the position of a lattice point of a square lattice, but may be disposed at the position of a lattice point of a triangular lattice. The diffractive lattice layer 6 has a periodic structure in which a refractive index changes two-dimensionally by the embedding of the different refractive index region, and thus functions as a diffractive lattice and also functions as a photonic crystal layer. In the drawing, the periodic structure in which complete round holes are arranged in a square lattice shape is used. However, a periodic structure in which triangular holes are arranged in a square lattice shape may be used, and a semiconductor laser element functions as a surface emission laser.

Meanwhile, a material of the above-described laser element will be described.

As an example of a material of a semiconductor laser element constituting the laser beam generation region LD, the semiconductor substrate 1 is constituted by GaAs, the lower clad layer 2 is constituted by AlGaAs, the lower light guide layer 3 is constituted by AlGaAs, the active layer 4 is constituted by a multiple quantum well structure MQW (barrier layer: AlGaAs/well layer: InGaAs), the upper light guide layer 5 is constituted by AlGaAs which is a lower layer and GaAs which is an upper layer, the upper clad layer 7 is constituted by AlGaAs, and the contact layer 8 is constituted by GaAs. Regarding the diffractive lattice layer (phase modulation layer, refractive index modulation layer) 6, the base layer 6A is constituted by GaAs, and the different refractive index region (embedded layer) 6B embedded in the base layer 6A is constituted by AlGaAs.

Meanwhile, first conductivity type (N-type) impurities or second conductivity type (P-type) impurities are added to each layer (the concentration of the impurities is $1 \times 10^{17}$ to $1 \times 10^{21}/cm^3$), so that the semiconductor substrate 1 can be set to be an N type, the lower clad layer 2 can be set to be an N type, the lower light guide layer 3 can be set to be an I type, the active layer 4 can be set to be an I type, the lower layer of the upper light guide layer 5 can be set to be a P or I type, the upper layer thereof can be set to be an I type, the diffractive lattice layer 6 can be set to be an I type, the upper clad layer 7 can be set to be a P type, and the contact layer 8 can be set to be a P type. Meanwhile, a region having no impurities intentionally added thereto is set to be genuineness (I type). The concentration of I type impurities is equal to or less than $1 \times 10^{16}/cm^3$.

In addition, for example, the thickness of the semiconductor substrate 1 can be set to 150 μm (80 μm to 350 μm), the thickness of the lower clad layer 2 can be set to $2 \times 10^3$ nm ($1 \times 10^3$ nm to $3 \times 10^3$ nm), the thickness of the lower light guide layer 3 can be set to 150 nm (0 nm to 300 nm), the thickness of the active layer 4 can be set to 30 nm (10 nm to 100 nm), the thickness of the lower layer of the upper light guide layer 5 can be set to 50 nm (10 nm to 100 nm), the thickness of the upper layer thereof can be set to 50 nm (10 nm to 200 nm), the thickness of the diffractive lattice layer 6 can be set to 100 nm (50 nm to 200 nm), the thickness of the upper clad layer 7 can be set to $2 \times 10^3$ nm ($1 \times 10^3$ nm to $3 \times 10^3$ nm), and the thickness of the contact layer 8 can be set to 200 nm (50 nm to 500 nm). Meanwhile, the values in parentheses are preferred values.

In addition, an energy band gap of the clad layer is set to be larger than an energy band gap of the light guide layer, and the energy band gap of the light guide layer is set to be larger than all energy band gap of the well layer of the active layer 4. In AlGaAs, it is possible to easily change an energy band gap and a refractive index by changing a composition ratio of Al. In $Al_XGa_{1-X}As$, when a composition ratio X of AL having a small atomic radius is relatively decreased (increased), an energy band gap having a positive correlation therewith is decreased (increased). When InGaAs is formed by mixing In having a large atomic radius with GaAs, an energy band gap is decreased. That is, a composition ratio of Al of the clad layer is larger than a composition ratio of Al of the light guide layer, and the composition ratio of Al of the light guide layer is equal to or greater than that of the barrier layer (AlGaAs) of the active layer. The composition ratio of Al of the clad layer is set to 0.2 to 0.4, and is set to 0.3 in this example. The composition ratio of Al of the barrier layer in the light guide layer and the active layer is set to 0.1 to 0.15, and is set to 0.1 in this example. Meanwhile, in order to suppress the leakage of electrons from the active layer, a layer having a thickness of approximately 10 nm to 100 nm may be inserted between the guide layer and the second conductivity type (p-type) clad layer with the same Al composition as the clad layer.

Meanwhile, the different refractive index region having a columnar shape in the diffractive lattice layer 6 may be configured as a gap, and gas such as air, nitrogen, or argon may be enclosed in the gap. In addition, in the diffractive lattice layer 6, the different refractive index region 6B is disposed at the position of the lattice point of the square lattice or the triangular lattice in the XY plane. An interval between vertical and horizontal grid lines in the square lattice has a value obtained by dividing a wavelength of a laser beam by an equivalent refractive index, and specifically, is preferably set to approximately 300 nm. The different refractive index region may be disposed at the position of the lattice point in the triangular lattice instead of the position of the lattice point of the square lattice. An interval between horizontal and inclined grid lines in a case of the triangular lattice is obtained by dividing a wavelength of a laser beam by an equivalent refractive index and further dividing Sin 60°, and specifically, is preferably set to approximately 350 nm.

Meanwhile, when unit vectors of orthogonal coordinates are set to be x and y in a case of a square lattice having a lattice interval a, basic translation vectors satisfy the relations of $a_1=ax$ and $a_2=ay$, basic reciprocal lattice vectors satisfy the relations $b_1=(2\pi/a)y$ and $b_2=(2\pi/a)x$ with respect to the basic translation vectors $a_1$ and $a_2$. When a Γ point in a photonic band of photonic crystal, that is, a wave number vector $k=nb_1+mb_2$ (n and m are any integers), a resonance mode (standing wave in the XY plane) in which a lattice interval a is equal to a wavelength λ is obtained.

In addition, the above-described common electrode and pixel electrode are formed of ITO or ZnO in a case where the electrodes are configured as transparent electrodes. Such materials are transparent with respect to a laser beam, and can transmit the laser beam.

In addition, the reflection film 23 mentioned above is constituted by a single layer film or a multilayer mirror of a metal such as aluminum, and the multilayer mirror is configured by alternately stacking a high refractive index material layer (referred to as nH) and a low refractive index material layer (referred to as nL) having a relatively low refractive index with respect to the high refractive index material layer. The material of the high refractive index material layer (nH) includes at least one material (for example, $Ta_2O_5$) selected from an oxide group (insulator group) including $Ta_2O_5$, $TiO_2$, $Nb_2O_5$, $HfO_2$, and the like. The material low refractive index material layer (nL) includes at least one material (for example, $SiO_2$) selected from an insulator group including $SiO_2$, $MgF_2$, and the like. An optical film thickness of each of the high refractive material layer (nH) and the low refractive index material layer (nL) is set to a quarter of a wavelength λ of a laser beam. The following types of stacked structures of these dielectric layers are considered.

(1): A first structure is a structure in which a set (A) constituted by the low refractive index material layer (nL) and the high refractive material layer (nH) is repeatedly stacked m times. In this case, a total number of layers is 2×A×m. Here, m is a natural number. Meanwhile, the lowermost layer is set to be the low refractive index material layer (nL).

(2): A second structure is a structure in which the above-described set (A) is repeatedly stacked m times, and the low refractive index material layer (nL) is further stacked on the high refractive material layer (nH) positioned on the uppermost surface. In this case, a total number of layers is 2×A×m+1.

(3): In the above-described structure of (1) or (2), it is also possible to adopt a structure in which the positions of the high refractive index material layer (nH) and the low refractive index material layer (nL) are replaced with each other.

In a case of the structure of (3), the lowermost layer is the high refractive index material layer (nH).

Finally, the above-described semiconductor laser element will be briefly described.

In the manufacture of the semiconductor laser element, each compound semiconductor layer uses a metalorganic chemical vapor deposition (MOCVD) method. Although crystal growth is performed on a (001) surface of the semiconductor substrate 1, the invention is not limited thereto. In the manufacture of a laser element using AlGaAs, a growth temperature of AlGaAs is 500° C. to 850° C. In an experiment, a growth temperature of 550° C. to 700° C. is adopted. In the growth, trimethyl aluminium (TMA) is used as an Al raw material, trimethyl gallium (TMG) and triethyl gallium (TEG) are used as gallium raw materials, arsine ($AsH_3$) is used as an As raw material, disilane ($Si_2H_6$) is used as a raw material for N-type impurities, and diethyl zinc (DEZn) is used as a raw material for P-type impurities. In the growth of AlGaAs, TMA, TMG, and arsine are used. In the growth of GaAs, TMG and arsine are used, but TMA is not used. InGaAs is manufactured using TMG, trimethyl indium (TMI), and arsine. An insulating film may be formed by sputtering a target by using the constituent material of the insulating film as a raw material.

That is, the semiconductor laser element is formed by forming the N-type clad layer (AlGaAs) 2 on the N-type semiconductor substrate (GaAs) 1, forming the light guide layer (AlGaAs) 3, the multiple quantum well structure (InGaAs/AlGaAs) 4, and the light guide layer (GaAs/AaGaAs) 5, and epitaxially growing the base layer (GaAs) 6A serving as a photonic crystal layer by using a metalorganic chemical vapor deposition (MOCVD) method.

Next, in order to achieve alignment after the epitaxial growth, a SiN layer is formed on the base layer 6A by a plasma CVD (PCVD) method, and a resist is formed on the SiN layer. Further, an alignment mark is formed by exposing and developing the resist, etching the SiN layer by using the resist as a mask, and partially leaving the SiN layer. The remaining resist is removed.

Next, another resist is applied to the base layer 6A, and a two-dimensional minute pattern is drawn on the resist by an electron beam drawing device on the basis of an alignment mark and is developed, whereby the two-dimensional minute pattern is formed on the resist. Thereafter, the two-dimensional minute pattern having a depth of approximately 100 nm is transferred onto the base layer 6A by dry etching by using the resist as a mask to thereby form a hole, and the resist is removed. The depth of the hole is 100 nm. A compound semiconductor serving as the different refractive index region 6B (AlGaAs) is grown in the hole again so as to have a depth equal to or greater than the depth of the hole. Next, the upper clad layer (AlGaAs) 7 and the contact layer (GaAs) 8 are sequentially formed by MOCVD, and an appropriate electrode material is formed on the upper and lower surfaces of the substrate by a vapor deposition method or a sputtering method, whereby first and second electrodes are formed. In addition, an insulating film can be formed on the upper and lower surfaces of the substrate by a sputtering method or the like when necessary.

In a case where the diffractive lattice layer 6 is provided below the active layer, the diffractive lattice layer may be formed on the lower clad layer before the active layer and the lower light guide layer are formed.

In the manufacture of the semiconductor laser element, the ¼ wavelength plate 26 is disposed on the semiconductor substrate 1 through the insulating film 9, and the polarizing plate 27 is disposed on the surface of the contact layer 8.

Meanwhile, in a case where the driving electrode E3 is formed on the semiconductor substrate 1, patterning is performed on the semiconductor substrate 1 by using a photolithography method.

As described above, according to the above-described device, light generated by the active layer is modulated by the diffractive lattice layer and is oscillated in a two-dimensional single mode, and a portion of the oscillated light is secondarily diffracted by the diffractive lattice layer and is incident on the liquid crystal layer as a plane wave. Since liquid crystal has refractive index anisotropy, an equivalent refractive index in a direction parallel to a light output changes depending on the rotation angle thereof. At this time, since a physical length of the liquid crystal layer is fixed, the length of a light path changes in association with a change in refractive index. Therefore, when a plane wave is incident on the liquid crystal layer from below, it is possible to change the length of the light path for each pixel. In other words, when the plane wave is incident on the liquid crystal layer from below, the phase thereof can be changed for each pixel, and thus it is possible to control the shape of an emission wave front. In this manner, a laser beam oscillated in a two-dimensional single mode is incident on the liquid crystal layer as a plane wave, and a wave front having been subjected to phase modulation for each pixel is obtained as a light output from below.

Figure 4:
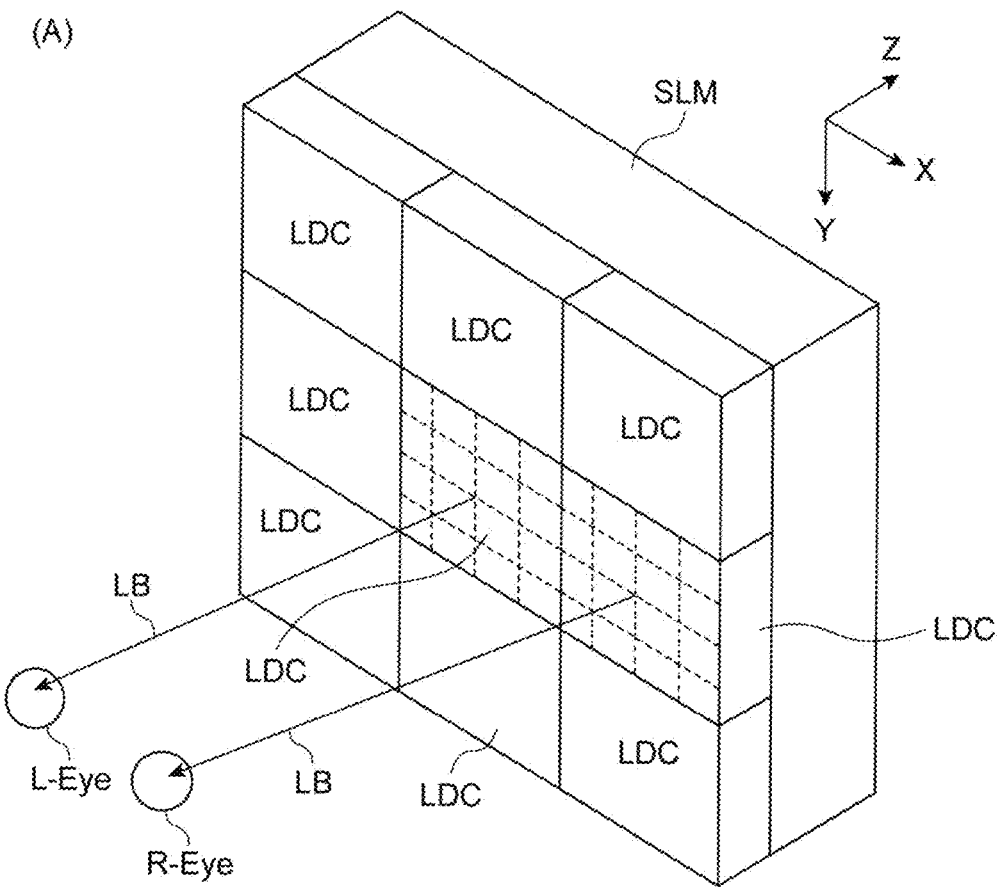
FIG. 4 is a diagram illustrating a perspective view (FIG. 4(A)) of the semiconductor laser device and a plan view (FIG. 4(B)) of a semiconductor laser unit as a unit element.
Figure 4:
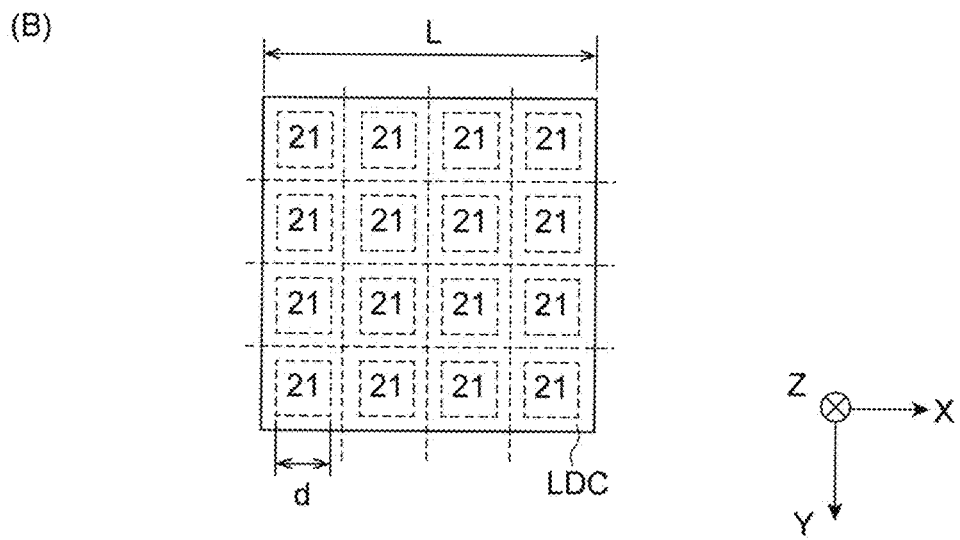

FIG. 4 is a diagram illustrating a perspective view (FIG. 4(A)) of the semiconductor laser device and a plan view (FIG. 4(B)) of a semiconductor laser unit as a unit element.

The plurality of semiconductor laser chips LDC are two-dimensionally arranged within the XY plane, and can be independently driven. Since the spatial light modulator SLM is disposed on the back side of each of the semiconductor laser chips LDC, a laser beam is emitted toward a specific direction from each of the semiconductor laser chips LDC. For example, when 4×4=16 pixel electrodes 21 are disposed in one semiconductor laser chip LDC and the width of the semiconductor laser chip LDC in the X-axis direction is assumed to be L, the width of the pixel electrode 21 in the X-axis direction is d and the relation of L≥4×d is established. Meanwhile, the dimensions thereof in the Y-axis direction are the same as those in the X-axis direction.

A first laser beam LB which is output from one semiconductor laser chip LDC is incident on an observer's right eye R-Eye, and a second laser beam LB which is output from another semiconductor laser chip LDC is incident on the observer's left eye L-Eye. Since the laser beam LB incident on the right eye and the laser beam LB incident on the left eye can be independently controlled, it is possible to form a stereoscopic image.

Figure 2:
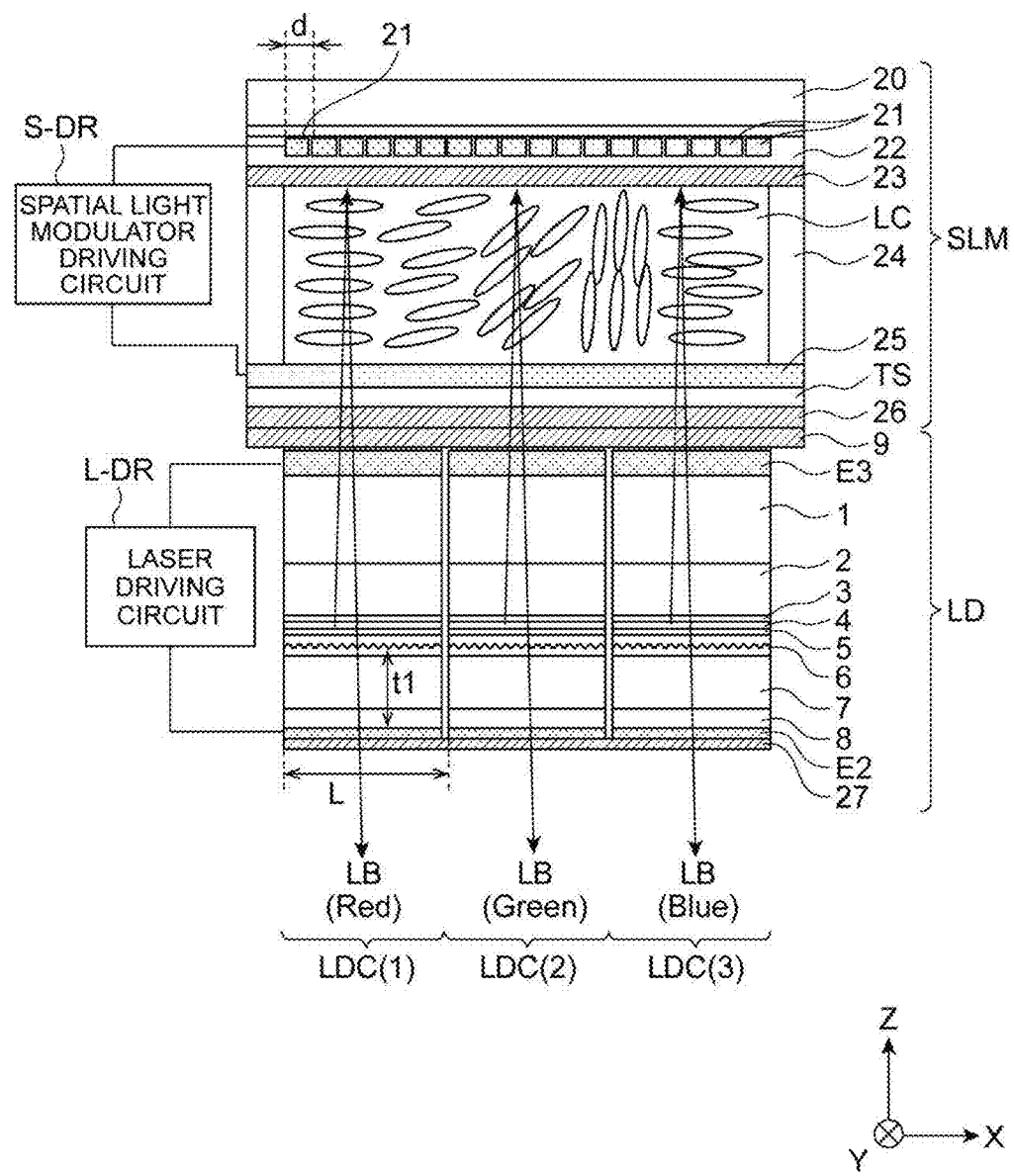
FIG. 2 is a diagram illustrating a configuration in the longitudinal section of a semiconductor laser device according to a second embodiment.

FIG. 2 is a diagram illustrating a configuration in the longitudinal section of a semiconductor laser device according to a second embodiment.

In this semiconductor laser device, a plurality of semiconductor laser chips (semiconductor laser unit) LDC include a first semiconductor laser unit LDC(1) that outputs a laser beam LB having a first wavelength (Red), a second semiconductor laser unit LDC(2) that outputs a laser beam LB having a second wavelength (Green), and a third semiconductor laser unit LDC(3) that outputs a laser beam LB having a third wavelength (Blue). The first, second, and third wavelengths are different from each other, and three or more types of wavelengths can be used.

According to this semiconductor laser device, laser beams having three or more types of wavelengths are used, and thus it is possible to form a stereoscopic image having various colors by superimposing the laser beams on each other.

Figure 3:
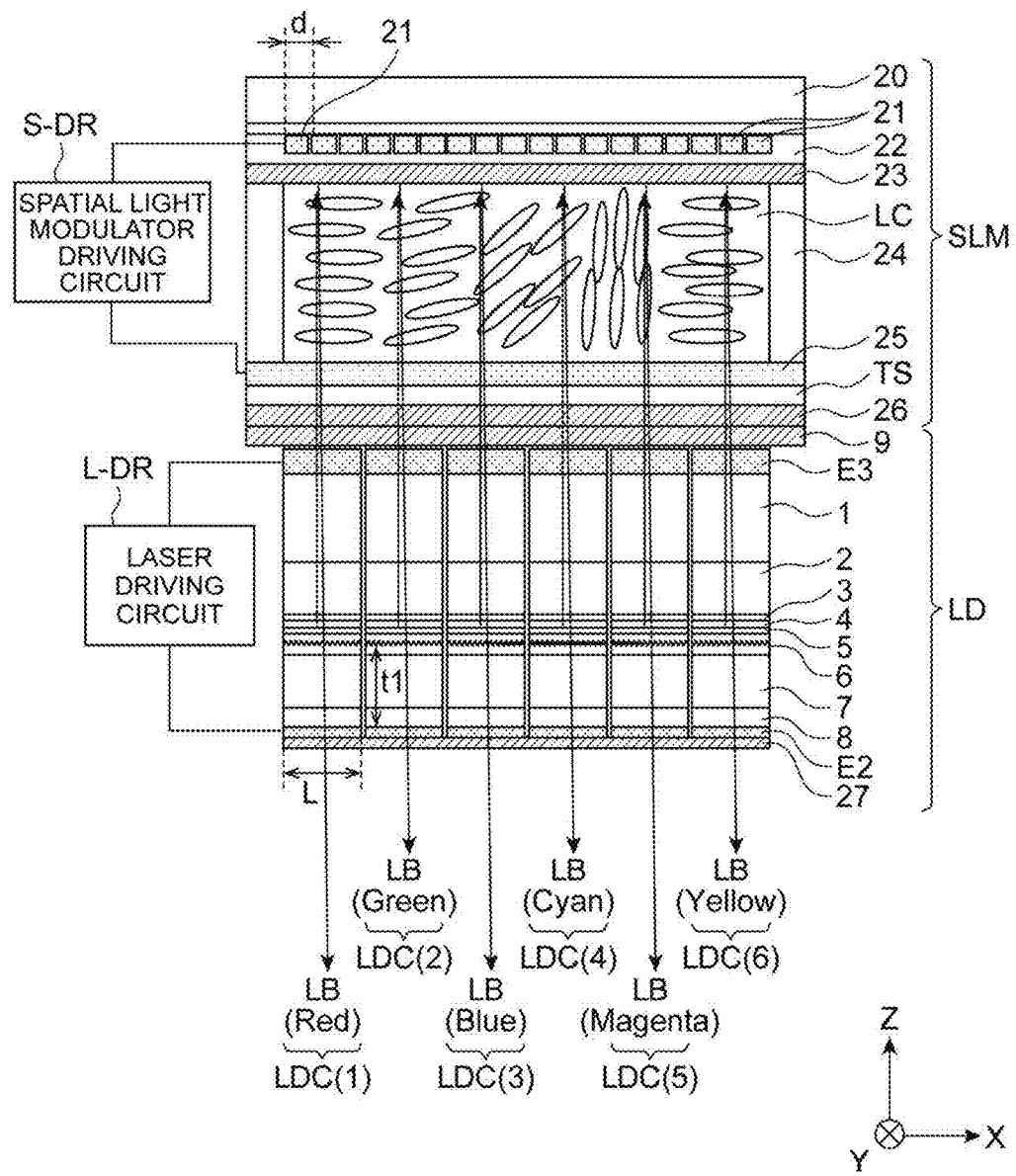
FIG. 3 is a diagram illustrating a configuration in the longitudinal section of a semiconductor laser device according to a third embodiment.

FIG. 3 is a diagram illustrating a configuration in the longitudinal section of a semiconductor laser device according to a third embodiment.

In this semiconductor laser device, a plurality of semiconductor laser chips (semiconductor laser unit) LDC include a fourth semiconductor laser unit LDC(4) that outputs a laser beam LB having a fourth wavelength (Cyan), a fifth semiconductor laser unit LDC(5) that outputs a laser beam LB having a fifth wavelength (Magenta), and a sixth semiconductor laser unit LDC(6) that outputs a laser beam LB having a sixth wavelength (Yellow), in addition to the semiconductor laser units in the second embodiment. The first, second, third, fourth, fifth, and sixth wavelengths are different from each other, and six or more types of wavelengths can be used.

According to this semiconductor laser device, laser beams having six or more types of wavelengths can be used, and thus it is possible to form a stereoscopic image having further various colors.

As described above, the above-described semiconductor laser device is a semiconductor laser device including a plurality of semiconductor laser units LDC capable of independently driven and a spatial light modulator SLM which is optically coupled to a group of the plurality of semiconductor laser units LDC, and includes the following elements.

(1) Each of the semiconductor laser units LDC include an active layer 4, a pair of clad layers 2 and 7 having the active layer 4 interposed therebetween, and a diffractive lattice layer 6 which is optically coupled to the active layer 4, and the plurality of semiconductor laser units LDC output laser beams along the respective thickness directions.

(2) The spatial light modulator SLM includes a liquid crystal layer LC, a reflection film 23 provided on a side opposite to the semiconductor laser unit LDC with respect to the liquid crystal layer LC, a plurality of pixel electrodes 21 that are two-dimensionally disposed, and a common electrode that interposes the liquid crystal layer LC between the common electrode and the pixel electrodes 21. A width d of each of the pixel electrodes 21 is equal to or less than half of a width L of each of the semiconductor laser units LDC.

(3) A laser beam which is emitted from each of the semiconductor laser units LDC is incident on the spatial light modulator SLM, is modulated in accordance with the state of the liquid crystal layer LC based on the pixel electrodes 21, and is reflected by the reflection film 23 of the spatial light modulator SLM. The modulated laser beam is output to the outside from a light emitting surface (the surface of the polarizing plate 27 on the −Z-axis side) of each of the semiconductor laser units LDC again through each of the semiconductor laser units LDC.

(4) The semiconductor laser device includes a ¼ wavelength plate (phase difference plate) 26 disposed between a group of the active layers 4 of the plurality of semiconductor laser units LDC and the reflection film 23, and the polarizing plate 27 disposed between the group of the active layers 4 of the plurality of semiconductor laser units LDC and the light emitting surface. One polarizing plate 27 is provided and covers all of the semiconductor laser units LDC, but may be separated for each semiconductor laser unit.

According to this semiconductor laser device, a laser beam which is output from the semiconductor laser unit LDC, which is a surface-emission laser element, is emitted along the thickness direction, is reflected by the reflection film 23 of the spatial light modulator SLM, is subjected to phase modulation in the liquid crystal layer LC, and is output to the outside through the polarizing plate 27. Therefore, the direction of a laser beam which is subjected to phase modulation and is output from the polarizing plate for each pixel is different in accordance with the intensity of modulation in the liquid crystal layer LC. A laser beam to be emitted to the outside from the semiconductor laser unit LDC without going through the spatial light modulator SLM can be suppressed by the polarizing plate 27. That is, regarding a laser beam passing through the ¼ wavelength plate 26 twice by being incident on the spatial light modulator SLM and being reflected, the phase of the laser beam is reversed, and thus the polarization azimuth thereof is rotated at 90 degrees. Accordingly, the laser beam passes through the polarizing plate 27.

That is, when the polarization azimuth of the laser beam in the active layer 4 is set to be a first direction (A), a polarization azimuth (B) transmitted by the polarizing plate 27 is perpendicular to the first direction (A), and the laser beam cannot directly pass through a wavelength plate. On the other hand, the laser beam having passed through the ¼ wavelength plate twice has the polarization azimuth (B) perpendicular to the first direction (A) in a case where there is no liquid crystal layer LC, and can pass through the polarizing plate 27. A bias voltage is applied between the pixel electrode 21 and the common electrode 25, and thus only a polarization component of which the phase is adjusted by the liquid crystal layer LC passes through the polarizing plate 27.

The width of the pixel electrode is smaller than that of each semiconductor laser unit, and two or more pixel electrodes are disposed corresponding to a single semiconductor laser unit. Thereby, light generated from each semiconductor laser unit LDC goes to and returns from the spatial light modulator SLM and is then two-dimensionally subjected to phase modulation for each pixel of the spatial light modulator SLM. As a result, it is possible to control a beam pattern for each semiconductor laser unit LDC. Therefore, a signal is applied to a spatial light modulator driving circuit S-DR so as to apply a peak beam having a direction controlled as an output beam pattern, and thus it is possible to output the peak beam in any direction for each semiconductor laser unit LDC. At this time, an arrangement period L of the semiconductor laser unit LDC is set to equal to or less than half the diameter of the pupil of an eye, and thus it is possible to form a natural stereoscopic image of an integral system. At this time, a maximum diffraction angle $\Phi$ of the peak beam in any direction from each semiconductor laser unit LDC can be represented by $\Phi \approx \lambda/d$ by using a pixel pitch d of the spatial light modulator SLM and a wavelength $\lambda$, and thus it is necessary to appropriately set a small d in order to obtain a desired $\Phi$.

Meanwhile, in the above-described example, the peak beam is output in any direction for each semiconductor laser unit LDC, but it is possible to obtain any beam pattern for each LDC as long as the pixel pitch d has an appropriate value and to obtain a plurality of beams in any direction for each semiconductor laser unit LDC. In this case, the beams in multiple directions are simultaneously obtained in parallel, and thus it is possible to increase the number of viewpoints when a natural stereoscopic image is displayed and formed. Alternatively, it is possible to increase a frame rate by setting the same number of viewpoints.

Meanwhile, 90-degree polarization rotation of the liquid crystal layer LC may be performed in a non-bias state, and 0-degree polarization rotation thereof may be performed. In any case, it is possible to perform adjustment to a desired polarization azimuth by applying a bias voltage to the pixel electrode.

REFERENCE SIGNS LIST

SLM: SPATIAL LIGHT MODULATOR
LDC: SEMICONDUCTOR LASER CHIP (SEMICONDUCTOR LASER UNIT)
4: ACTIVE LAYER
2, 7: CLAD LAYER
6: DIFFRACTIVE LATTICE LAYER

The invention claimed is:

1. A semiconductor laser device comprising:
a plurality of semiconductor laser units that are capable of being independently driven; and
a spatial light modulator that is optically coupled to the semiconductor laser units,
wherein each of the semiconductor laser units includes
an active layer,
a pair of layers that has the active layer interposed therebetween, and
a diffractive lattice layer that is optically coupled to the active layer,
wherein the semiconductor laser units output laser beams along respective thickness directions,
wherein the spatial light modulator includes:
a liquid crystal layer,
a reflection film that is provided on a side opposite to the semiconductor laser units with respect to the liquid crystal layer,
a plurality of pixel electrodes that are two-dimensionally disposed, and
a common electrode that sandwiches the liquid crystal layer together with the pixel electrodes,
wherein a laser beam emitted from each of the semiconductor laser units is incident on the spatial light modulator and is modulated in accordance with a state of the liquid crystal layer based on the pixel electrodes,
wherein the laser beam reflected by the reflection film of the spatial light modulator and modulated is output to an outside from a light emitting surface of each of the semiconductor laser units again through each of the semiconductor laser units,
wherein the semiconductor laser device further comprises:
a ¼ wavelength plate that is disposed between the active layers of the semiconductor laser units and the reflection film, and
a polarizing plate that is disposed between the active layers of the semiconductor laser units and the light emitting surface,
wherein the semiconductor laser units are attached to the spatial light modulator,
wherein both of the active layer and the diffractive lattice layer are sandwiched by the clad layers, and
wherein the diffractive lattice layer includes a periodic structure in which a refractive index changes two-dimensionally.

2. The semiconductor laser device according to claim 1, wherein a width of each of the pixel electrodes is equal to or less than half a width of each of the semiconductor laser units.

3. The semiconductor laser device according to claim 1, wherein the plurality of semiconductor laser units include
a first semiconductor laser unit that outputs a laser beam having a first wavelength,
a second semiconductor laser unit that outputs a laser beam having a second wavelength, and
a third semiconductor laser unit that outputs a laser beam having a third wavelength, and wherein the first, second, and third wavelengths are different from each other.

4. The semiconductor laser device according to claim 3, wherein the plurality of semiconductor laser units include
a fourth semiconductor laser unit that outputs a laser beam having a fourth wavelength,
a fifth semiconductor laser unit that outputs a laser beam having a fifth wavelength, and
a sixth semiconductor laser unit that outputs a laser beam having a sixth wavelength, and
wherein the first, second, third, fourth, fifth, and sixth wavelengths are different from each other.

5. The semiconductor laser device according to claim 2, wherein the plurality of semiconductor laser units include
a first semiconductor laser unit that outputs a laser beam having a first wavelength,
a second semiconductor laser unit that outputs a laser beam having a second wavelength, and
a third semiconductor laser unit that outputs a laser beam having a third wavelength, and
wherein the first, second, and third wavelengths are different from each other.

6. A semiconductor laser device comprising:
semiconductor laser units each comprising:
  a first clad layer;
  a second clad layer;
  an active layer arranged between the first clad layer and the second clad layer; and
  a diffractive lattice layer optically coupled to the active layer, arranged between the first clad layer and the second clad layer, and including a periodic structure in which a refractive index changes two-dimensionally;
a spatial light modulator attached to and optically coupled to the semiconductor laser units, comprising:
  a liquid crystal layer;
  a reflection film provided on a side opposite to the semiconductor laser units with respect to the liquid crystal layer;
  pixel electrodes arranged two-dimensionally;
  a common electrode that sandwiches the liquid crystal layer together with the pixel electrodes;
  a ¼ wavelength plate disposed between the active layers of the semiconductor laser units and the reflection film; and
  a polarizing plate disposed between the active layers of the semiconductor laser units and a light emitting surface of the semiconductor laser units.

7. The semiconductor laser device according to claim 6, wherein a width of each of the pixel electrodes is equal to or less than half a width of each of the semiconductor laser units.

8. The semiconductor laser device according to claim 6, wherein the semiconductor laser units comprise:
a first semiconductor laser unit that outputs a laser beam having a first wavelength,
a second semiconductor laser unit that outputs a laser beam having a second wavelength, and
a third semiconductor laser unit that outputs a laser beam having a third wavelength, and
wherein the first, second, and third wavelengths are different from each other.

9. The semiconductor laser device according to claim 8, wherein the semiconductor laser units include:
a fourth semiconductor laser unit that outputs a laser beam having a fourth wavelength,
a fifth semiconductor laser unit that outputs a laser beam having a fifth wavelength, and
a sixth semiconductor laser unit that outputs a laser beam having a sixth wavelength, and
wherein the first, second, third, fourth, fifth, and sixth wavelengths are different from each other.

10. The semiconductor laser device according to claim 7, wherein the plurality of semiconductor laser units include
a first semiconductor laser unit that outputs a laser beam having a first wavelength,
a second semiconductor laser unit that outputs a laser beam having a second wavelength, and
a third semiconductor laser unit that outputs a laser beam having a third wavelength, and
wherein the first, second, and third wavelengths are different from each other.

* * * * *